(12) United States Patent
Deruty et al.

(10) Patent No.: US 12,199,579 B2
(45) Date of Patent: Jan. 14, 2025

(54) GENERATION OF OUTPUT DATA BASED ON SOURCE SIGNAL SAMPLES AND CONTROL DATA SAMPLES

(71) Applicant: Sony Group Corporation, Tokyo (JP)

(72) Inventors: Emmanuel Deruty, Stuttgart (DE); Matthias Demoucron, Stuttgart (DE)

(73) Assignee: SONY GROUP CORPORATION, Tokyo (JP)

( * ) Notice: Subject to any disclaimer, the term of this patent is extended or adjusted under 35 U.S.C. 154(b) by 556 days.

(21) Appl. No.: 17/439,412

(22) PCT Filed: Feb. 28, 2020

(86) PCT No.: PCT/EP2020/055272
§ 371 (c)(1),
(2) Date: Sep. 15, 2021

(87) PCT Pub. No.: WO2020/200596
PCT Pub. Date: Oct. 8, 2020

(65) Prior Publication Data
US 2022/0158600 A1    May 19, 2022

(30) Foreign Application Priority Data
Mar. 29, 2019    (EP) .................................... 19166336

(51) Int. Cl.
*H03G 11/08*  (2006.01)
*H03G 5/00*   (2006.01)
*H03G 5/16*   (2006.01)

(52) U.S. Cl.
CPC ............. *H03G 11/08* (2013.01); *H03G 5/005* (2013.01); *H03G 5/165* (2013.01)

(58) Field of Classification Search
CPC ......... H03G 11/08; H03G 5/005; H03G 5/165
See application file for complete search history.

(56) References Cited

U.S. PATENT DOCUMENTS 7,447,722 B2    11/2008  McGrath et al.
2014/0072132 A1*  3/2014  Gautama .............. H04B 1/1027
                                                        381/71.1

(Continued)

FOREIGN PATENT DOCUMENTS

EP      3093848 A1 * 11/2016
WO   2013/163448 A1   10/2013
WO   2017/124007 A1    7/2017

OTHER PUBLICATIONS

Grachten et al., "Auto-Adaptive Resonance Equalization Using Dilated Residual Networks", ArXiv.Org, Jul. 23, 2018, pp. 1-16.

(Continued)

*Primary Examiner* — David L Ton
(74) *Attorney, Agent, or Firm* — XSENSUS LLP

(57) ABSTRACT

A signal processing method, especially for audio signals, comprises: receiving input signal samples having source signal portions associated with respective time periods (In_n−1); generating parameters associated with the respective time periods by processing the respective input signal samples, in which the step of generating the parameters has an associated non-zero latency period so that generating step provides a parameter p in a time period (T_n−1) later than the start of the respective time period; and generating an output data portion associated with a given time period (Out_n−1 using a signal processing function F which depends upon the input signal samples in the given time period (In_n−1) and an approximated parameter p' (1110) associated with a time period other than the given time period (T_n−2).

20 Claims, 10 Drawing Sheets

(56) References Cited

U.S. PATENT DOCUMENTS

2016/0227257 A1    8/2016  Frishman et al.
2021/0152967 A1*   5/2021  Deruty .................... H04S 1/007

OTHER PUBLICATIONS

International Search Report and Written Opinion mailed on May 27, 2020, received for PCT Application PCT/EP2020/055272, Filed on Feb. 28, 2020, 12 pages.

* cited by examiner

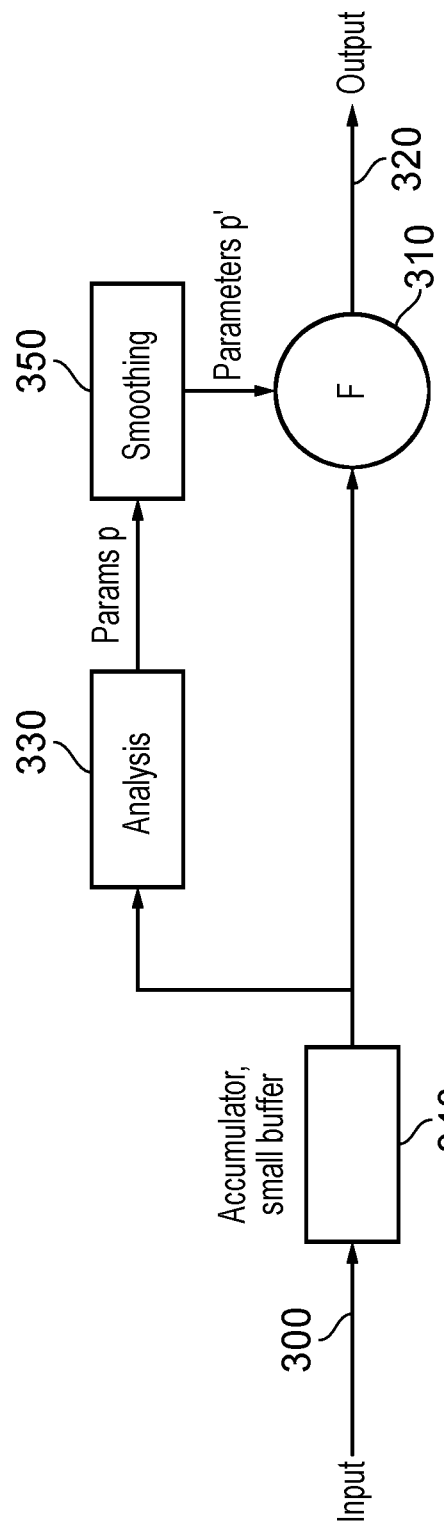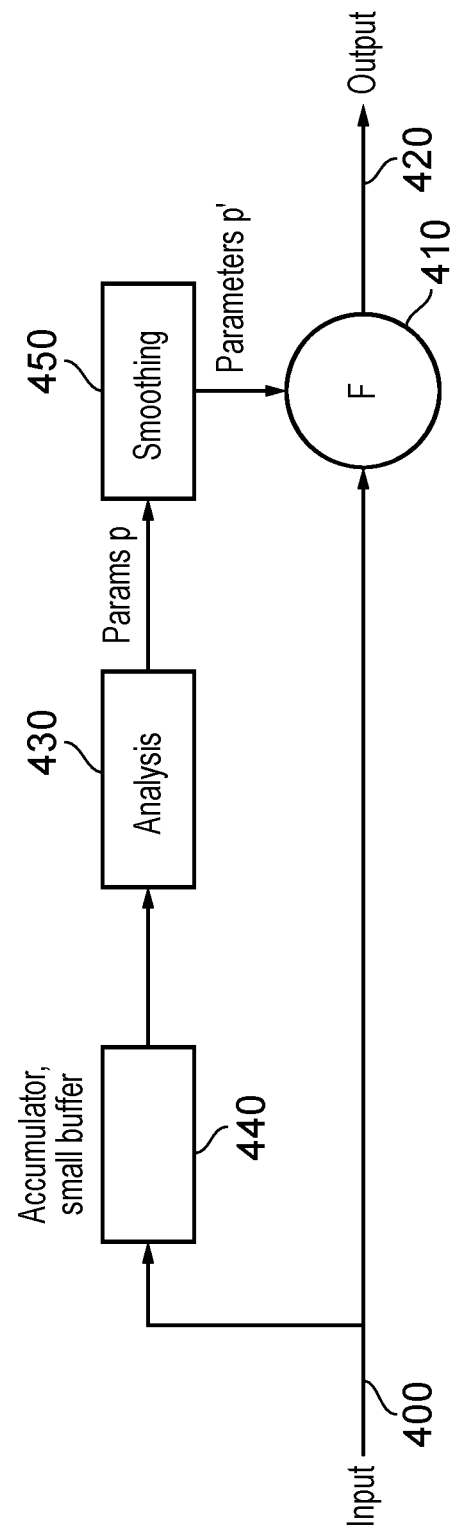
FIG. 3
FIG. 4

GENERATION OF OUTPUT DATA BASED ON SOURCE SIGNAL SAMPLES AND CONTROL DATA SAMPLES

CROSS-REFERENCE TO RELATED APPLICATIONS

The present application is based on PCT filing PCT/EP2020/055272, filed Feb. 28, 2020, which claims priority to EP 19166336.8, filed Mar. 29, 2019, the entire contents of each are incorporated herein by reference.

BACKGROUND

Field

This disclosure relates to signal processing.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, is neither expressly or impliedly admitted as prior art against the present disclosure.

Signal processing techniques, such as real-time digital signal processing, often involve delay (latency) related to the buffering of the input data. There are different possible sources of buffering latency.

When the process involves the transformation of the input data (e.g. filtering), there might be some latency due to the amount of input data required to perform the transformation. For example, a transformation in the spectral domain (using Fourier transform) can only be performed when a given amount of data is available (for example a so-called Fourier analysis window). In this case, in an example of audio signal processing, latencies as high as 4096 samples or 9 milliseconds (ms) are common. On the other hand, strictly temporal transformations (for example finite impulse response, FIR, or infinite impulse response, IIR, filters, or convolution-based transformations) can be performed on a per-sample basis and need not involve buffering latency.

A second (additional or alternative) source of latency may arise with processes requiring input analysis to adapt the transformation applied to the input data. An analysis based on Fourier transform results in buffering latencies equal to the size of the Fourier analysis window. When the algorithm involves the processing of the signal by convolutional neural networks, the amount of needed data can increase (again in an example as applied to audio signals) to 500 ms or more.

In the audio field, a latency of 9 ms is audible and is therefore potentially a problem, depending on the application in use. In live music situations for instance, high latency values are unacceptable. In particular, latencies resulting from convolutional neural networks (500 ms of more) simply prohibits the use of such a neural network based process in real-time.

SUMMARY

The present disclosure provides a signal processing method comprising:

generating control data portions associated with respective time periods by processing a sampled source signal having source signal portions associated with respective time periods, in which the step of generating the control data portions has an associated non-zero latency period so that the step of generating control data portions provides a control data portion later than the start of the associated time period; and generating an output data portion associated with a given time period using a processing operation which depends upon the given time period of the sampled input signal and a control data portion associated with a time period other than the given time period.

The present disclosure also provides signal processing apparatus comprising:

control data generator circuitry configured to generate control data portions associated with respective time periods by processing a sampled source signal having source signal portions associated with respective time periods, in which the generation of the control data portions by the control data generator circuitry has an associated non-zero latency period so as to provide a control data portion later than the start of the associated time period; and output data generator circuitry configured to generate an output data portion associated with a given time period using a processing operation which depends upon the given time period of the sampled input signal and a control data portion associated with a time period other than the given time period.

Further respective aspects and features of the present disclosure are defined in the appended claims.

It is to be understood that both the foregoing general description and the following detailed description are exemplary, but are not restrictive, of the present technology.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, in which:

FIGS. 1 to 4 schematically illustrate signal processing systems;

DESCRIPTION OF THE PREFERRED EMBODIMENTS

Figure 1:
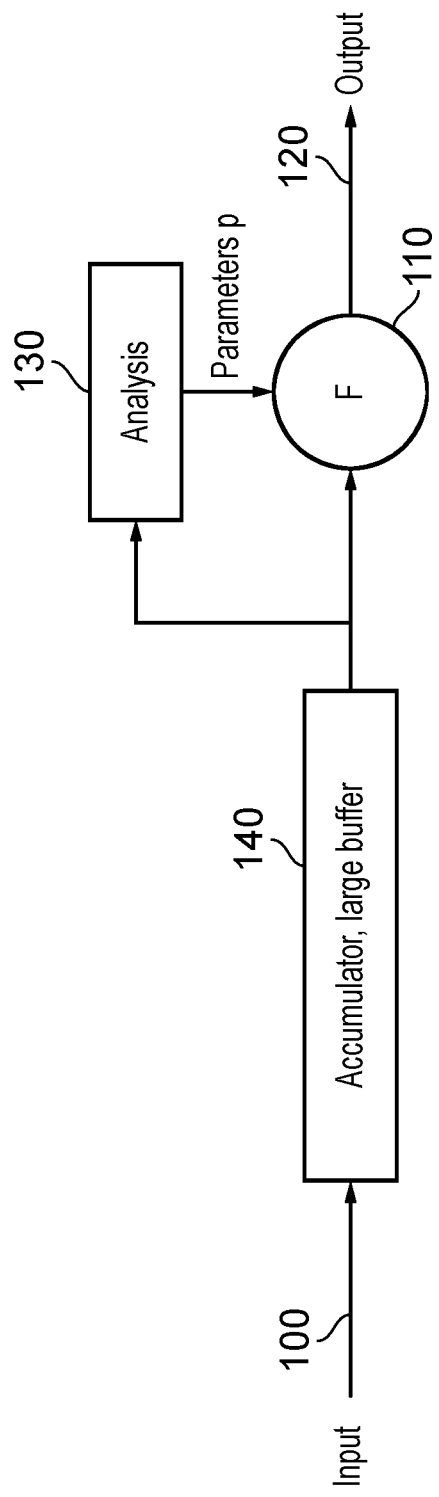

Referring now to the drawings, FIG. 1 schematically illustrates an example signal processing arrangement in which input samples 100 are subject to a signal processing function F 110 to generate output samples 120. The signal processing function F is controlled by parameters p generated by analysis circuitry 130. In the context of the discussion to be continued below, the parameters p may be considered as control data to control the processing operation or function F, so that the analysis circuitry 130 is considered as control data generation circuitry.

The control data can be generated as portions, which may correspond to time windows but may in other examples be associated with individual sample positions. Similarly, the input and output samples may be considered as portions, which in some embodiments are windows of multiple samples, but in other examples may be individual samples. The portions can be contiguous (that is to say, one portion is adjacent to a next portion and a preceding portion), or non-contiguous, or even (in situations where a portion represents more than one sample) overlapping. The portions can all be of the same size or can have different sizes.

In the example of FIG. 1, the process as shown requires accumulating N samples (typically a large number of samples, for example several seconds' worth of samples in an example arrangement in which the input signal 100 is an audio signal) in a buffer 140. The analysis circuitry 130 acts on data from the buffer 140 and the function F also acts on data from the buffer 140. The overall latency between the input signal 100 and the output signal 120 is large, being at least as high as a time period corresponding to the number of samples accumulated in the buffer 140.

Figure 2:
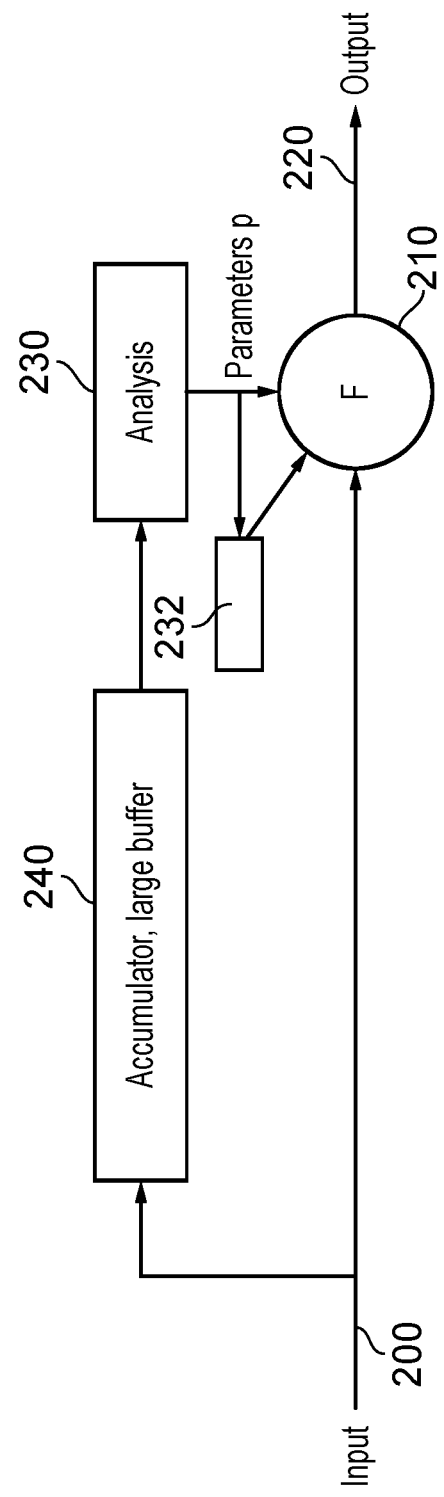

In FIG. 2, an input signal 200 is processed by a function F 210 to generate an output signal 220. Once again, a buffer 240 is provided in order to buffer samples being provided to analysis circuitry 230 which generates parameters p to control the processing function F.

In FIG. 3, a "small" buffer 340 is provided to buffer samples of an input signal 300 to be processed by a function F 310 to generate an output signal 320. Here, the term "small" is in comparison with the multiple second length of the buffer described with reference FIGS. 1 and 2, and may represent a buffer of a few samples, for example, or a single window of, say, 10 ms of audio (in an audio example) in the case of a windowed processing function F such as a fast Fourier transform (FFT) function.

Note that instead of audio signals, other types of signals could be relevant to these techniques, such as sensor signals for example from real-world sensors where processing is performed to process the sensor signals with respect to correlation and temporal trends, radio frequency signals such as RADAR signals, image signals or the like.

Analysis circuitry 330 generates parameters p which are then subject to smoothing by smoothing circuitry 350 to generate smoothed parameters p' which are actually used for controlling the function F. The reason for the smoothing operation is that the parameters p are not considered as stable from one frame to a next frame (at least for audio signals such as musical signals) but having been smoothed by the smoothing circuitry 350 the variation amongst the parameters p' with time is reduced.

In FIG. 4, once again an input signal is processed by a processing function F 410 to generate an output signal 420. Analysis circuitry 430 acts on samples which are accumulated in a small buffer 440 similar to the buffer 340 described above. Once again, smoothing circuitry 450 is provided to generate parameters p' which actually control the function F.

Note that there is no requirement that the functions F are the same as between each of the examples of FIGS. 1 to 4.

Each of the arrangements of FIGS. 1 to 4 has the potential to introduce latency into the processing. If the function F is dependent upon buffered data then this will in itself introduce latency. This situation arises in FIGS. 1 and 3. By moving the buffer into the analysis path in FIGS. 2 and 4, there is the potential to reduce the latency associated with this signal path from input to output, but in the case that the function F has to wait for the parameters p or p' associated with the same time window as a currently processed time window of the input signal 200, 400, then this constraint reintroduces the latency into the signal path.

For this reason and to reduce that signal path latency, in example embodiments to be discussed below, a technique is provided of approximating, for use in generation of output data 220, 420 by the processing operation or function F, the parameters or control data associated with a current time window or position in the input data by another (for example the most recently generated) set of parameters p or p' available at the start of generating a portion of output data 220, 420.

The function F can involve, for example, applying a frequency transform (such as an FFT) to the input samples to generate frequency-transformed data, and processing the frequency-transformed data according to a control data portion. In other examples, the generation of the control data can involve performing an FFT process. In other example situations, such as loudness detection, volume control and/or automation and analysis based on neural networks, a frequency transform is not required.

Figure 5:
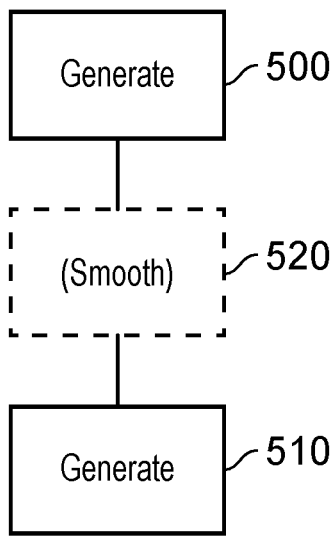
FIGS. 5 and 6 are schematic flowcharts illustrating respective methods.

By way of summary of the processes discussed here, FIG. 5 is a schematic flowchart illustrating a signal processing method comprising:

generating (at a step 500) control data portions associated with respective time periods by processing a sampled source signal having source signal portions associated with respective time periods, in which the step of generating the control data portions has an associated non-zero latency period so that the step of generating control data portions provides a control data portion later than the start of the associated time period; and generating (at a step 510) an output data portion associated with a given time period using a processing operation which depends upon the given time period of the sampled input signal and a control data portion associated with a time period other than the given time period.

For example, the control data portion associated with a time period other than the given time period comprises a control data portion which is most-recently generated at the start of generating the output data portion.

This process has the overall effect of approximating, for use in the step of generating the output data portion, the control data portion associated with the given time period by using a substitute, different, control data portion, for example one which is most-recently generated at the start of generating the output data portion.

Optionally, a further step 520 can be provided, comprising smoothing the control data portions with respect to successive time periods, for example using the smoothing filter 450 such as an FIR or IIR low pass filter.

The steps 500, 510 can be performed in real time, for example.

In another optional arrangement shown schematically by the flowchart of FIG. 6, a step 600 is identical to the step 500 discussed with reference to FIG. 5. A further optional arrangement is shown at a step 620, however, comprising detecting a rate of change (ROC) of the control data portions with respect to the time periods. This can be performed by the analysis circuitry and/or the circuitry implementing the function F, or by control circuitry 232 (FIG. 2), or as an assessment at a design stage of the process or an apparatus or circuitry to implement the process, or as a configuration stage at the start of or before processing a batch of data. If, as an outcome of the detection at the step 620, the detected rate of change is less than or equal to a threshold rate of change (Thr) then control passes to a step 630 at which a process corresponding to the step 510 is performed. If not (which is to say that the detected ROC is greater than Thr) then control passes to a step 640 at which the operation of the approximation discussed above is inhibited in response to a detected rate of change greater than a threshold rate of change. In other words, at the step 640, processing may proceed but with the additional latency discussed above.

Figure 6:
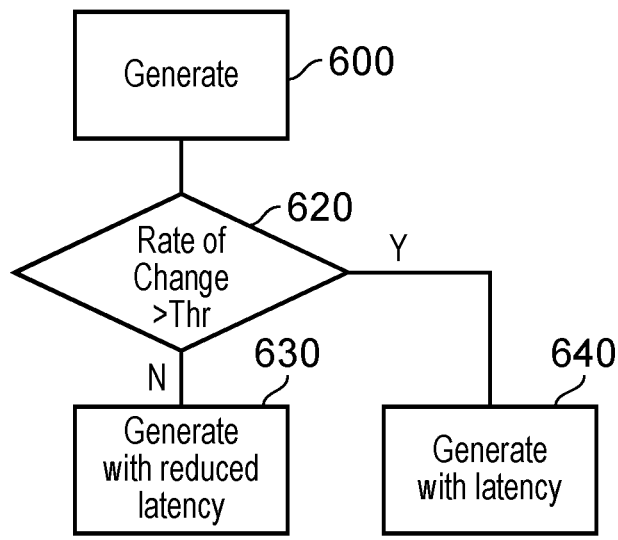

Therefore, in summary of FIG. 6, for a rate of change of the control data portions with respect to the time periods of less than a threshold rate of change, the output data portion associated with the given time period is generated (at the step 630) using a processing operation which depends upon the given time period of the sampled input signal and a control data portion associated with time period other than the given time period; and for a rate of change of the control data portions with respect to the time periods of greater than the threshold rate of change, the output data portion associated with the given time period is generated (at the step 640) using a processing operation which depends upon the given time period of the sampled input signal and a control data portion associated with the given time period. The step 630 can alleviate the latency of the control data generation as discussed above, whereas at least some of that alleviation does not take place in the step 640.

The skilled person will appreciate that a comparison of "less than or equal Thr" and "greater than Thr" can equivalently be expressed as "less than Thr2" and "greater than or equal to Thr2", where Thr2 may be the same as or marginally higher than Thr. The only difference is which outcome of the step 620 applies when ROC is equal to the threshold.

It will be appreciated that in systems with a smoothing filter, there is a reduced need of the control circuitry and the ROC thresholding as the parameters of the filter can be set to ensure in at least most cases that the ROC is sufficiently low. However, the two arrangements can be used together as a precaution against excursions outside of the normal ROC range provided by the smoothing filter.

Figure 7:
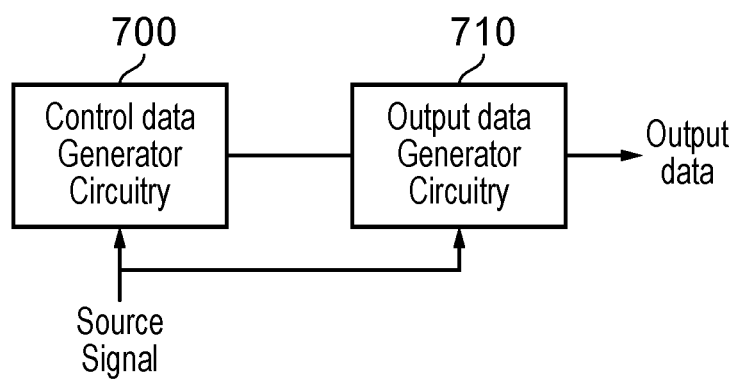
FIG. 7 schematically illustrates a signal processing system.

FIG. 7 schematically illustrates an example of signal processing apparatus to implement the present techniques, the apparatus comprising:

control data generator circuitry 700 configured to generate control data portions associated with respective time periods by processing a sampled source signal having source signal portions associated with respective time periods, in which the generation of the control data portions by the control data generator circuitry has an associated non-zero latency period so as to provide a control data portion later than the start of the associated time period; and output data generator circuitry 710 configured to generate an output data portion associated with a given time period using a processing operation which depends upon the given time period of the sampled input signal and a control data portion associated with a time period other than the given time period.

Note also that the present techniques may also be implemented by general purpose data processing apparatus operating under software control. An example of such apparatus will be described below with reference to FIG. 14.

The techniques just described can operate particularly usefully when either the control data is slowly varying or the control data is smoothed so as to make it slowly varying (as in the case of the smoothed data or parameters p').

Considering some technical contents in which slowly varying parameters of the type discussed above can be useful, assume that the function F is a gain control or equalizer control function in the context of modifying an audio signal, for example in a digital audio mixing arrangement, and the parameters p or p' represent control parameters based upon signal correlations between pairs or groups of input signals or the like. In the example case of audio signals, human perception of level changes introduced by gain automation are such that fast changes will be apparent to a listener, whereas a slow changes may remain largely unnoticed. Slow gain changes or slow equaliser changes can be useful, for example, in live audio settings, where a noticeable sudden corrective change of timbre would potentially not be welcome.

In arrangements in which the function F comprises at least a gain control, this provides an example in which generation of an output data portion comprises at least applying a gain to the sampled source signal in dependence upon a control data portion.

FIGS. 8 to 13 provide examples of operations using the techniques described above. In each case, time is represented as running from left to right of the diagram as drawn.

Figure 8:
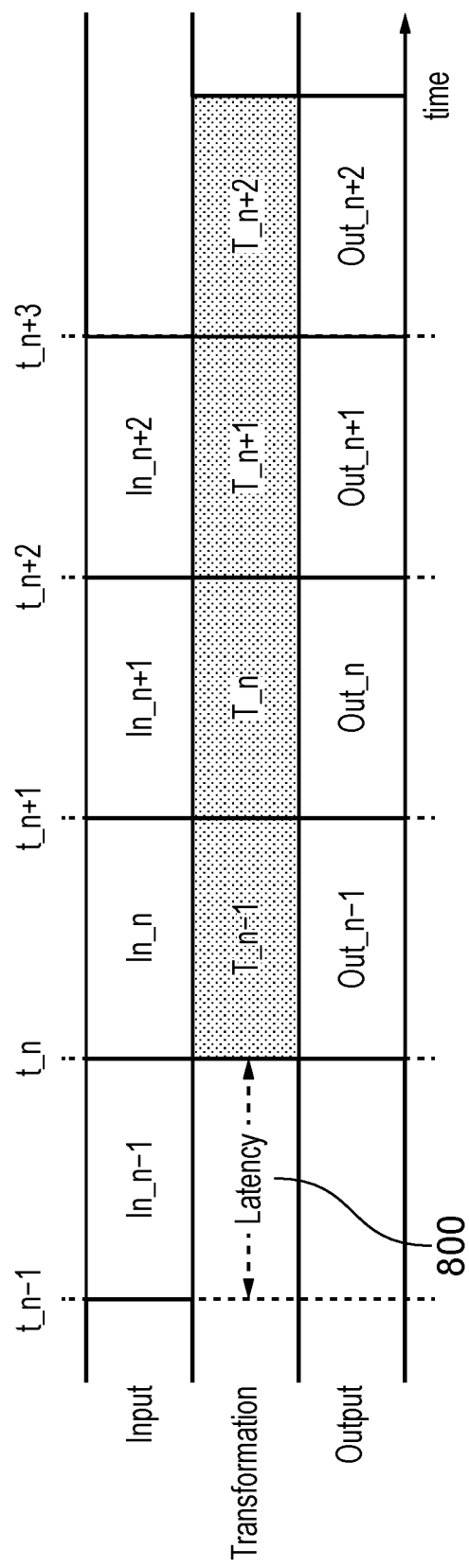
FIGS. 8 to 13 are schematic timing diagrams.

Referring to FIG. 8, an upper line represents temporal portions of an input signal, a middle line represents a transformation performed by the analysis circuitry to generate parameters p or control data portions, and a lower line represents an output signal. In the example of FIG. 8, the generation of the parameters requires a full window In_m of data before it can be carried out, and since in the example of FIG. 8 the function F waits for the parameters corresponding to a period of input data before generating the corresponding period of output data Out_m, there is a latency introduced into the system.

Figure 9:
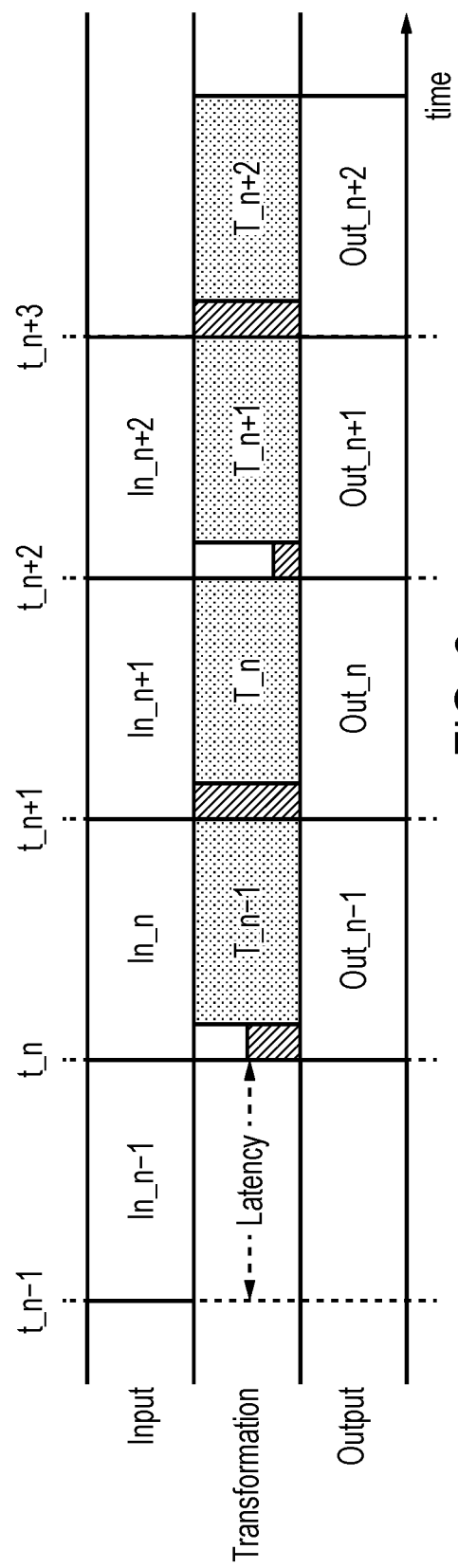
Figure 10:
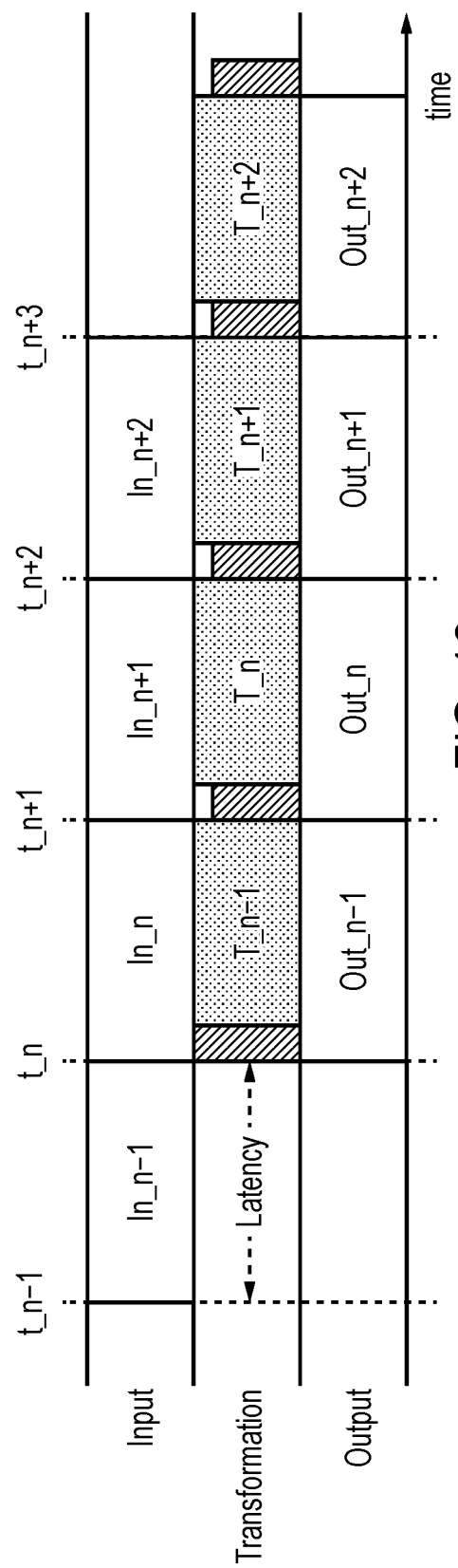

The parameters p can evolve with time slowly or quickly. FIG. 9 schematically illustrates parameters p (represented by the shaded height of a left hand portion of each transformation block T_m as varying significantly from portion to portion, whereas in FIG. 10 the variation is much more gentle). This can be because of intrinsic properties of the transformation itself or because the smoothing filter discussed above is employed.

Figure 11:
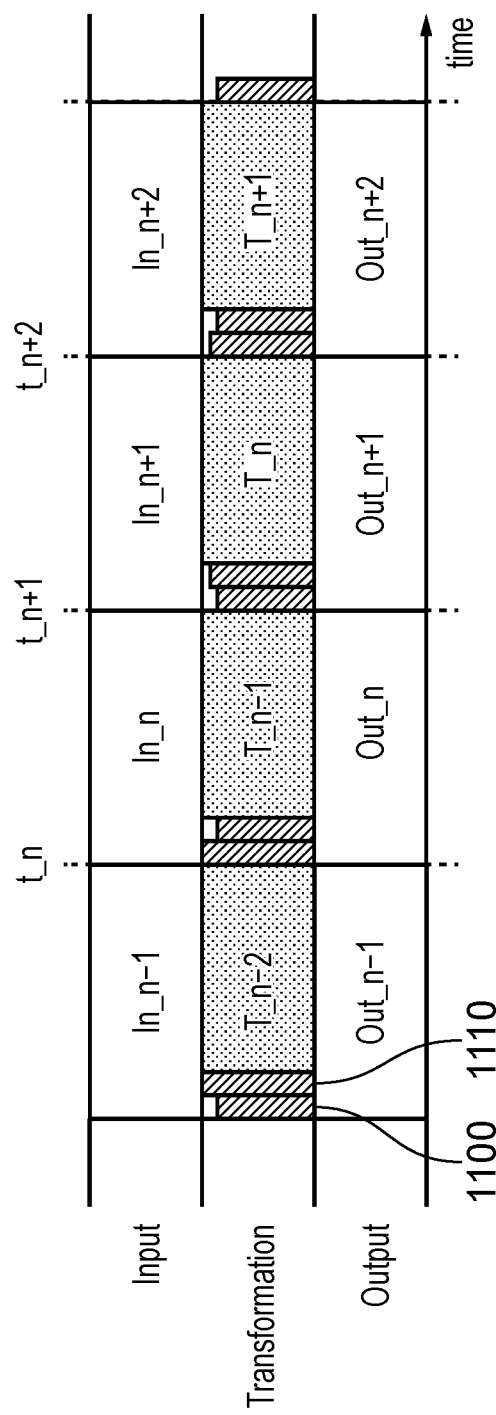

In FIG. 11, the approximating technique discussed above is used, so that instead of waiting for the parameters appropriate to a portion of input data to be available before the corresponding portion of output data is generated, the system uses other (for example the most recently generated) parameters as an approximation of the correct parameters. This is considered an acceptable approximation in the context of relatively slowly varying parameters.

In FIG. 11, a left hand block 1100 in each period illustrates (by the height of its shaded portion) the "correct" parameters associated with a data portion m whereas the right hand block 1110 represents, by the height of its shaded portion, the approximation obtained by using the most recently available parameters in this example. Note that parameters other than the most recently available ones could be used, for example the last-but-one available set.

Figure 12:
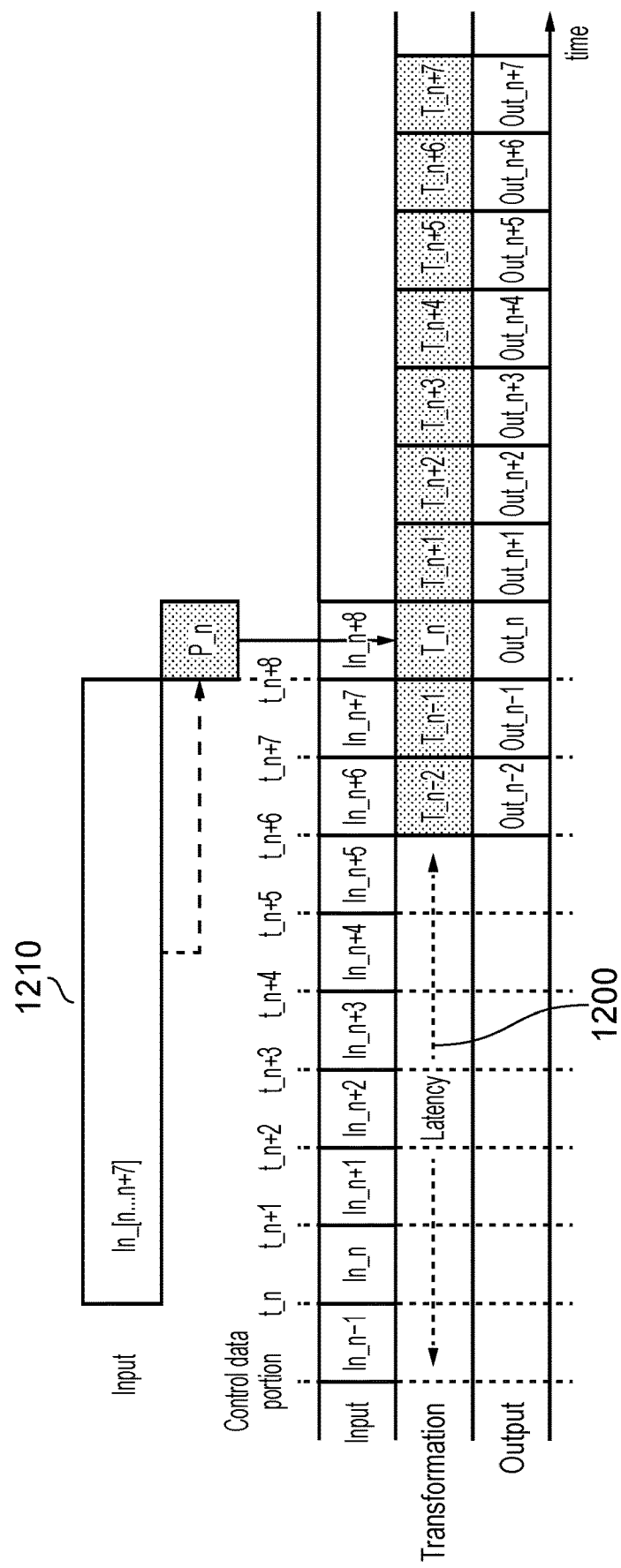
Figure 13:
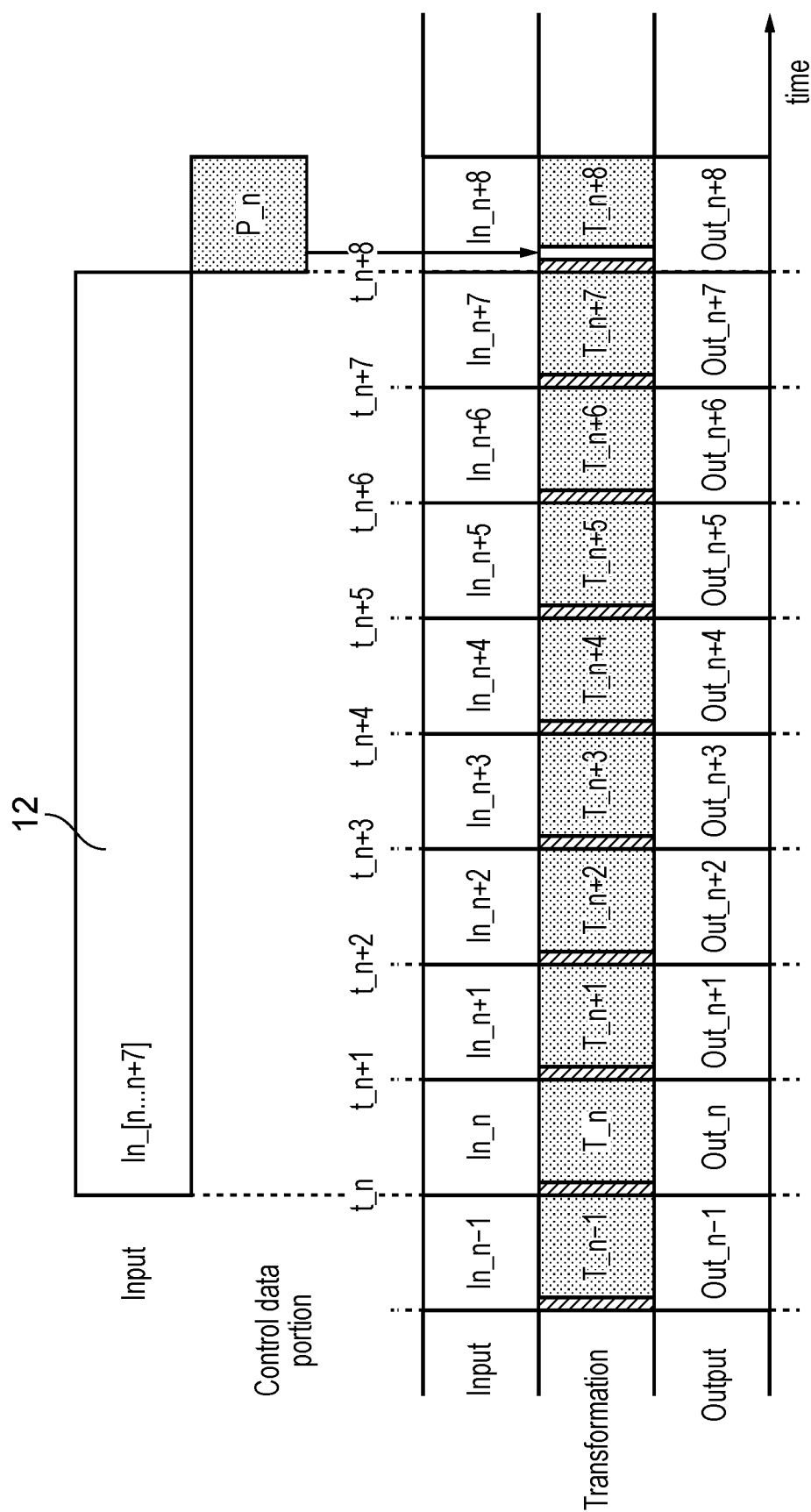

In another example, relevant to the "large buffer" arrangements of FIGS. 1 and 2, FIG. 12 schematically illustrates the latency 1200 obtained by waiting for the "correct" set of parameters T_m in order to generate an output data portion Out_m, where the generation of the parameters or control data portion relies upon a large buffer 1210 of input samples. In FIG. 13, the most recently available control data portion is used, so that this processing latency is reduced to a negligible amount or even zero.

Figure 14:
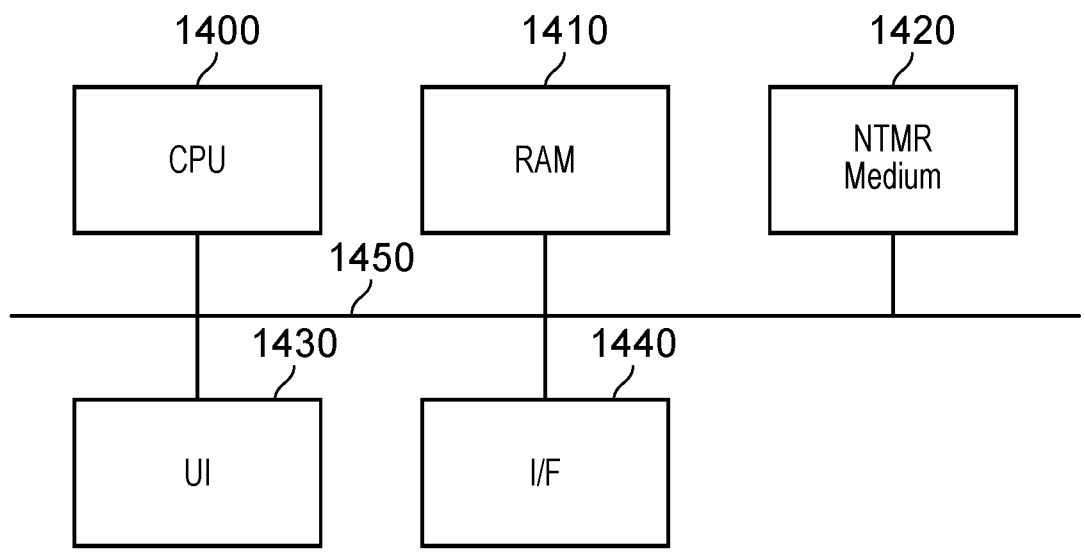
FIG. 14 is a schematic diagram illustrating a data processing system.

FIG. 14 schematically illustrates a data processing apparatus suitable to carry out the methods discussed above, comprising a central processing unit or CPU 1400, a random access memory (RAM) 1410, a non-transitory machine-readable memory or medium (NTMRM) 1420 such as a flash memory, a hard disc drive or the like, a user interface such as a display, keyboard, mouse, or the like 1430, and an input/output interface 1440. These components are linked together by a bus structure 1450. The CPU 1400 can perform any of the above methods under the control of program instructions stored in the RAM 1410 and/or the NTMRM 1420. The NTMRM 1420 therefore provides an example of a non-transitory machine-readable medium which stores computer software by which the CPU 1400 perform the method or methods discussed above.

Figure 15:
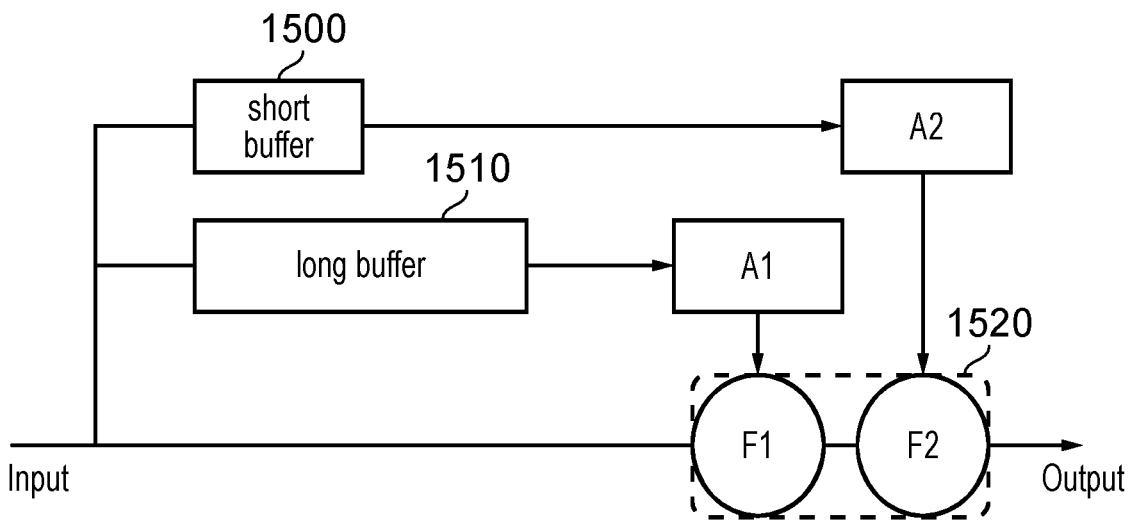
FIG. 15 schematically illustrates the decomposition of a process.

FIG. 15 schematically illustrates the decomposition of a process.

Again, although other types of signal are envisaged, considering an example in the field of audio signals, a process such as an equalisation process can potentially be decomposed into or considered as including (a) a slow process of control data generation that requires a certain amount of data (for example a slow-response dynamic equalizer) and (b) a fast process that requires not much data (such as a multi-band correction of attacks). It is possible to use the techniques discussed above to alleviate or avoid latency in the process (a), while allowing the process (b) to use control data associated with the time period of the current source data because the latency of the second process (b) is relatively low and can be tolerated. This example shows that the proposed techniques may help improve complex processes, not only slow processes exclusively.

In the example of FIG. 15, a process F2 uses control data generated by analysis circuitry A2 based on a short buffer 1500 of input data. Another process F1 uses control data generated by analysis circuitry A1 based on a long buffer 1510 of input data. In the context of the present techniques, therefore the generation of an output data portion comprises using a first function F1 dependent upon first control data portions and using a function F2 dependent upon second control data portions, the generation of the first control data portions having a greater associated latency than the generation of the second control data portions.

An approach provided by the present embodiments involves generating the output data portion associated with the given time period using the first processing operation F1 in dependence upon the given time period of the sampled input signal and a control data portion associated with time period other than the given time period (in other words, removing or avoiding the latency of the long buffer 1510 by approximating the control data portions as discussed above); and generating the output data portion associated with the given time period using the second processing operation F2 in dependence upon the given time period of the sampled input signal and a control data portion associated with the given time period (or in other words allowing the relatively short latency of the buffer 1500).

Note that as indicated by the broken line 1520 in FIG. 15, the functions F1 and F2 could in fact be a single function, or respective parts of a single function, receiving two inputs of control data for different respective analyses.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Similarly, a data signal comprising coded data generated according to the methods discussed above (whether or not embodied on a non-transitory machine-readable medium) is also considered to represent an embodiment of the present disclosure.

It will be apparent that numerous modifications and variations of the present disclosure are possible in light of the above teachings. It is therefore to be understood that within the scope of the appended clauses, the technology may be practised otherwise than as specifically described herein.

Various respective aspects and features will be defined by the following numbered clauses:

1. A signal processing method comprising:
   generating control data portions associated with respective time periods by processing a sampled source signal having source signal portions associated with respective time periods, in which the step of generating the control data portions has an associated non-zero latency period so that the step of generating control data portions provides a control data portion later than the start of the associated time period; and
   generating an output data portion associated with a given time period using a processing operation which depends upon the given time period of the sampled input signal and a control data portion associated with a time period other than the given time period.

2. A method according to clause 1, in which the control data portion associated with a time period other than the given time period comprises a control data portion which is most-recently generated at the start of generating the output data portion.

3. A method according to clause 1 or clause 2, comprising:
   performing the steps of generating the source data portions and generating the output data portion in real time.

4. A method according to any one of the preceding clauses, comprising:
   detecting a rate of change of the control data portions with respect to the time periods; and
   in response to a detected rate of change greater than a threshold rate of change, causing the step of generating an output data portion to generate the output data portion associated with the given time period using a processing operation which depends upon the given time period of the sampled input signal and a control data portion associated with the given time period.

5. A method according to any one of the preceding clauses, in which the step of generating an output data portion comprises:
   for a rate of change of the control data portions with respect to the time periods of less than a threshold rate of change, generating the output data portion associated with the given time period using a processing operation which depends upon the given time period of the sampled input signal and a control data portion associated with time period other than the given time period; and
   for a rate of change of the control data portions with respect to the time periods of greater than the threshold rate of change, generating the output data portion associated with the given time period using a processing operation which depends upon the given time period of the sampled input signal and a control data portion associated with the given time period.

6. A method according to any one of the preceding clauses, comprising smoothing the control data portions with respect to successive time periods.

7. A method according to any one of the preceding clauses, in which the input signal, the one or more source signals and the output signal are audio signals.

8. A method according to clause 7, in which the step of generating an output data portions comprises at least:
   applying a frequency transform to the sampled source signal to generate frequency-transformed data; and processing the frequency-transformed data according to a control data portion.

9. A method according to clause 8, in which the step of generating an output data portion has an associated latency of at least the given time period.

10. A method according to any one of clauses 7 to 9, in which the step of generating control data portions comprises at least:
applying a frequency transform to the sampled source signal.

11. A method according to any one of clauses 7 to 10, in which the step of generating an output data portion comprises at least applying a gain to the sampled source signal in dependence upon a control data portion.

12. A method according to any one of the preceding clauses, in which the step of generating an output data portion comprises:
using a first function dependent upon first control data portions and using a function dependent upon second control data portions, the generation of the first control data portions having a greater associated latency than the generation of the second control data portions;
generating the output data portion associated with the given time period using the first processing operation in dependence upon the given time period of the sampled input signal and a control data portion associated with time period other than the given time period; and
generating the output data portion associated with the given time period using the second processing operation in dependence upon the given time period of the sampled input signal and a control data portion associated with the given time period.

13. Computer software having program instructions which, when executed by a computer, causes the computer to perform the method of any one of the preceding clauses.

14. A non-transitory machine-readable medium which stores computer software according to clause 13.

15. Signal processing apparatus comprising:
control data generator circuitry configured to generate control data portions associated with respective time periods by processing a sampled source signal having source signal portions associated with respective time periods, in which the generation of the control data portions by the control data generator circuitry has an associated non-zero latency period so as to provide a control data portion later than the start of the associated time period; and
output data generator circuitry configured to generate an output data portion associated with a given time period using a processing operation which depends upon the given time period of the sampled input signal and a control data portion associated with a time period other than the given time period.

The invention claimed is:

1. A signal processing method comprising:
generating control data portions associated with respective time periods by processing a sampled source signal having source signal portions associated with respective time periods, in which the step of generating the control data portions has an associated non-zero latency period so that the step of generating control data portions provides a control data portion later than the start of the associated time period; and
generating an output data portion associated with a given time period using a processing operation which depends upon the given time period of the sampled input signal and a control data portion associated with a time period other than the given time period.

2. The method according to claim 1, in which the control data portion associated with a time period other than the given time period comprises a control data portion which is most-recently generated at the start of generating the output data portion.

3. The method according to claim 1, comprising: performing the steps of generating the control data portions and generating the output data portion in real time.

4. The method according to claim 1, comprising:
detecting a rate of change of the control data portions with respect to the time periods; and
in response to a detected rate of change greater than a threshold rate of change, causing the step of generating an output data portion to generate the output data portion associated with the given time period using a processing operation which depends upon the given time period of the sampled input signal and a control data portion associated with the given time period.

5. The method according to claim 1, in which the step of generating an output data portion comprises:
for a rate of change of the control data portions with respect to the time periods of less than a threshold rate of change, generating the output data portion associated with the given time period using a processing operation which depends upon the given time period of the sampled input signal and a control data portion associated with time period other than the given time period; and
for a rate of change of the control data portions with respect to the time periods of greater than the threshold rate of change, generating the output data portion associated with the given time period using a processing operation which depends upon the given time period of the sampled input signal and a control data portion associated with the given time period.

6. The method according to claim 1, comprising smoothing the control data portions with respect to successive time periods.

7. The method according to claim 1, in which the input signal, the one or more source signals and the output signal are audio signals.

8. The method according to claim 7, in which the step of generating an output data portions comprises at least:
applying a frequency transform to the sampled source signal to generate frequency-transformed data; and
processing the frequency-transformed data according to a control data portion.

9. The method according to claim 8, in which the step of generating an output data portion has an associated latency of at least the given time period.

10. The method according to claim 7, in which the step of generating control data portions comprises at least:
applying a frequency transform to the sampled source signal.

11. The method according to claim 7, in which the step of generating an output data portion comprises at least applying a gain to the sampled source signal in dependence upon a control data portion.

12. The method according to claim 1, in which the step of generating an output data portion comprises:
using a first function dependent upon first control data portions and using a second function dependent upon second control data portions, the generation of the first control data portions having a greater associated latency than the generation of the second control data portions;

generating the output data portion associated with the given time period using the first function in dependence upon the given time period of the sampled input signal and a control data portion associated with time period other than the given time period; and generating the output data portion associated with the given time period using the second function in dependence upon the given time period of the sampled input signal and a control data portion associated with the given time period.

13. A non-transitory machine-readable medium which stores computer software, which when executed by circuitry, causes the circuitry to perform the method of claim 1.

14. Signal processing apparatus comprising:
control data generator circuitry configured to generate control data portions associated with respective time periods by processing a sampled source signal having source signal portions associated with respective time periods, in which the generation of the control data portions by the control data generator circuitry has an associated non-zero latency period so as to provide a control data portion later than the start of the associated time period; and
output data generator circuitry configured to generate an output data portion associated with a given time period using a processing operation which depends upon the given time period of the sampled input signal and a control data portion associated with a time period other than the given time period.

15. An electronic device comprising:
circuitry configured to
generate control data portions associated with respective time periods by processing a sampled source signal having source signal portions associated with respective time periods, in which the generation of the control data portions by the control data generator circuitry has an associated non-zero latency period so as to provide a control data portion later than the start of the associated time period; and
generate an output data portion associated with a given time period using a processing operation which depends upon the given time period of the sampled input signal and a control data portion associated with a time period other than the given time period.

16. The electronic device of claim 15, wherein
the control data portion associated with a time period other than the given time period comprises a control data portion which is most-recently generated at the start of generating the output data portion.

17. The electronic device of claim 15, wherein
the circuitry is configured to perform the steps of generating the control data portions and generating the output data portion in real time.

18. The electronic device of claim 15, wherein the circuitry is configured to:
detect a rate of change of the control data portions with respect to the time periods; and
in response to a detected rate of change greater than a threshold rate of change, cause the step of generating an output data portion to generate the output data portion associated with the given time period using a processing operation which depends upon the given time period of the sampled input signal and a control data portion associated with the given time period.

19. The electronic device of claim 15, wherein
the circuitry is configured to smooth the control data portions with respect to successive time periods.

20. The electronic device of claim 15, wherein
the input signal, the one or more source signals and the output signal are audio signals.

* * * * *